United States Patent
Reid et al.

(10) Patent No.: US 7,811,925 B1
(45) Date of Patent: Oct. 12, 2010

(54) CAPPING BEFORE BARRIER-REMOVAL IC FABRICATION METHOD

(75) Inventors: Jonathan D. Reid, Sherwood, OR (US); Eric G. Webb, West Linn, OR (US); Edmund B. Minshall, Sherwood, OR (US); Avishai Kepten, Lake Oswego, OR (US); R. Marshall Stowell, Wilsonville, OR (US); Steven T. Mayer, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 240 days.

(21) Appl. No.: 12/184,145

(22) Filed: Jul. 31, 2008

Related U.S. Application Data

(63) Continuation of application No. 11/251,353, filed on Oct. 13, 2005, now Pat. No. 7,605,082.

(51) Int. Cl.
H01L 21/302 (2006.01)
H01L 21/461 (2006.01)
B24B 7/00 (2006.01)

(52) U.S. Cl. .......... 438/622; 451/64; 451/461; 156/345.12; 414/935; 438/690

(58) Field of Classification Search .......... 438/690, 438/745, 678; 414/935; 156/345.12; 451/64, 451/461; 213/2
See application file for complete search history.

(56) References Cited

U.S. PATENT DOCUMENTS

| 4,002,778 | A | 1/1977 | Bellis et al. |
|---|---|---|---|
| 4,181,760 | A | 1/1980 | Feldstein |
| 4,311,551 | A | 1/1982 | Sykes |
| 4,737,446 | A | 4/1988 | Cohen et al. |
| 4,981,725 | A | 1/1991 | Nuzzi et al. |
| 5,151,168 | A | 9/1992 | Gilton et al. |
| 5,318,803 | A | 6/1994 | Bickford et al. |
| 5,380,560 | A | 1/1995 | Kaja et al. |
| 5,382,447 | A | 1/1995 | Kaja et al. |

(Continued)

FOREIGN PATENT DOCUMENTS

JP 02111883 4/1990

(Continued)

OTHER PUBLICATIONS

U.S. Office Action mailed Jan. 23, 2007, from U.S. Appl. No. 11/251,353.

Andryuschenko et al., "Electroless and Electrolytic Seed Repair Effects on Damascene Feature Fill," Proceedings of International Interconnect Tech. Conf., San Francisco CA., Jun. 4-6, 2001, pp. 33-35.

(Continued)

*Primary Examiner*—W. David Coleman
(74) *Attorney, Agent, or Firm*—Weaver Austin Villeneuve & Sampson LLP

(57) ABSTRACT

Methods of forming a capping layer on conductive lines in a semiconductor device may be characterized by the following operations: (a) providing a semiconductor substrate comprising a dielectric layer having (i) exposed conductive lines (e.g., copper lines) disposed therein, and (ii) an exposed barrier layer disposed thereon; and (b) depositing a capping layer material on at least the exposed conductive lines of the semiconductor substrate. In certain embodiments, the method may also involve removing at least a portion of a conductive layer (e.g., overburden) disposed over the barrier layer and conductive lines to expose the barrier layer.

20 Claims, 5 Drawing Sheets

U.S. PATENT DOCUMENTS

| | | | |
|---|---|---|---|
| 5,486,234 | A | 1/1996 | Contolini et al. |
| 5,576,052 | A | 11/1996 | Arledge et al. |
| 5,674,787 | A | 10/1997 | Zhao et al. |
| 5,695,810 | A | 12/1997 | Dubin et al. |
| 5,770,095 | A | 6/1998 | Sasaki et al. |
| 5,891,513 | A | 4/1999 | Dubin et al. |
| 5,897,375 | A | 4/1999 | Watts et al. |
| 5,913,147 | A | 6/1999 | Dubin et al. |
| 5,969,422 | A | 10/1999 | Ting et al. |
| 5,972,192 | A | 10/1999 | Dubin et al. |
| 6,065,424 | A | 5/2000 | Shacham-Diamond et al. |
| 6,136,707 | A | 10/2000 | Cohen |
| 6,174,353 | B1 | 1/2001 | Yuan et al. |
| 6,184,124 | B1 | 2/2001 | Hasegawa et al. |
| 6,197,181 | B1 | 3/2001 | Chen |
| 6,197,364 | B1 | 3/2001 | Paunovic et al. |
| 6,270,619 | B1 * | 8/2001 | Suzuki et al. ........... 156/345.22 |
| 6,309,981 | B1 | 10/2001 | Mayer et al. |
| 6,329,284 | B2 | 12/2001 | Maekawa |
| 6,342,733 | B1 | 1/2002 | Hu et al. |
| 6,355,153 | B1 | 3/2002 | Uzoh et al. |
| 6,398,855 | B1 | 6/2002 | Palmans et al. |
| 6,537,416 | B1 | 3/2003 | Feng et al. |
| 6,586,342 | B1 | 7/2003 | Mayer et al. |
| 6,645,567 | B2 | 11/2003 | Mayer et al. |
| 6,664,122 | B1 | 12/2003 | Andryuschenko et al. |
| 6,692,546 | B2 | 2/2004 | Ma et al. |
| 6,692,873 | B1 | 2/2004 | Park |
| 6,713,122 | B1 | 3/2004 | Mayer et al. |
| 6,716,753 | B1 | 4/2004 | Shue et al. |
| 6,775,907 | B1 | 8/2004 | Boyko et al. |
| 6,815,349 | B1 | 11/2004 | Minshall et al. |
| 6,884,724 | B2 | 4/2005 | Hsu et al. |
| 6,887,776 | B2 | 5/2005 | Shang et al. |
| 7,262,504 | B2 | 7/2005 | Cheng et al. |
| 7,285,494 | B2 | 7/2005 | Cheng et al. |
| 6,975,032 | B2 | 12/2005 | Chen et al. |
| 7,008,871 | B2 | 3/2006 | Andricacos et al. |
| 7,049,234 | B2 | 5/2006 | Cheng et al. |
| 7,056,648 | B2 | 6/2006 | Cooper et al. |
| 7,124,386 | B2 * | 10/2006 | Smith et al. .................... 716/10 |
| 7,217,649 | B2 * | 5/2007 | Bailey et al. ................. 438/622 |
| 7,338,908 | B1 | 3/2008 | Koos et al. |
| 2001/0038448 | A1 | 11/2001 | Jun et al. |
| 2002/0084529 | A1 | 7/2002 | Dubin et al. |
| 2003/0003711 | A1 | 1/2003 | Modak |
| 2003/0059538 | A1 | 3/2003 | Chung et al. |
| 2003/0075808 | A1 | 4/2003 | Inoue et al. |
| 2003/0176049 | A1 | 9/2003 | Hegde et al. |
| 2003/0190426 | A1 | 10/2003 | Padhi et al. |
| 2003/0203616 | A1 | 10/2003 | Chung et al. |
| 2004/0065540 | A1 | 4/2004 | Chebiam et al. |
| 2004/0253740 | A1 | 12/2004 | Shalyt et al. |
| 2005/0074967 | A1 | 4/2005 | Kondo et al. |
| 2005/0158985 | A1 | 7/2005 | Chen et al. |
| 2005/0250339 | A1 | 11/2005 | Shea et al. |
| 2005/0266265 | A1 | 12/2005 | Cheng et al. |
| 2006/0205204 | A1 | 9/2006 | Beck |

FOREIGN PATENT DOCUMENTS

| | | |
|---|---|---|
| JP | 03122266 | 5/1991 |
| WO | 99/47731 | 9/1999 |

OTHER PUBLICATIONS

Chen et al., "ECD Seed Layer for Inlaid Copper Metallisation," Semiconductor Fabtech—12th Edition, 5 Pages, Jul. 2000.

Ken M. Takahashi, "Electroplating Copper into Resistive Barrier Films," Journal of the Electrochemical Society, 147 (4) 1417-1417 (2000).

T.P. Moffat et al., "Superconformal Electrodeposition of Copper in 500-90 nm Features," Journal of the Electrochemical Society, 147 (12) 4524-4535 (2000).

Ritzdorf et al., "Electrochemically Deposited Copper," Conference Proceedings ULSI XV 2000, Materials Research Society, 101-107.

Reid et al., "Optimization of Damascene Feature Fill for Copper Electroplating Process," Shipley Company, IITC 1999, 3 Pages.

Reid et al., "Copper PVD and Electroplating," Solid State Technology, Jul. 2000, www.solid-state.com, 86-103.

Reid et al., "Factors Influencing Fill of IC Features Using Electroplated Copper," Adv Met Conf Proc 1999, MRS 10 Pages, (2000).

Shacham-Diamond et al., "Copper Electroless Deposition Technology for Ultr-Large-Scale-Integration (ULSI) Metallization," Microelectronic Engineering 33 (1997) 47-58.

Hu et al., "Effects of Overlayers on Electromigration Reliability Improvement for Cu/Low K Interconnects," Presented in the Proceedings of the 42nd Annual IRPS held Apr. 25-29, 2004, p. v, article published May 28, 2004, 7 pages.

Park et al., "Electroless Layer Plating Process and Apparatus", Novellus Systems, Inc., U.S. Appl. No. 10/235,420, filed Sep. 30, 2002.

U.S. Office Action dated Sep. 1, 2005 for U.S. Appl. No. 10/235,420.

Sullivan et al, Electrolessly Deposited Diffusion Barriers For Microelectronics, E. J. IBM J Res Develop vol. 42, No. 4 Sep. 1998, 607-620.

T. Itabashi et al., "Electroless Deposited CoWB for Copper Diffusion Barrier Metals," Hitachi Research Laboratory, IEEE, 2002, 285-287.

Yosi Shacham-Diamand and Sergey Lopatin, "Integrated Electroless Metallization for ULSI," Elecrochimica Acta, (44 (19999) 3639-3649.

Theoretical Studies on the Electroless Metal Deposition Reaction Mechanism Group, printed from website http://www.appchem.waseda.ac.jp on Jul. 3, 2002. Published prior to the filing of this application. 3 Pages.

Office Action mailed Jul. 27, 2007, from U.S. Appl. No. 11/586,394.

Mayer et al., "Pad-Assisted Electropolishing," Novellus Systems, Inc., U.S. Appl. No. 11/213,190, filed Aug. 26, 2005.

Mayer et al., "Topography Reduction and Control by Selective Accelerator Removal," Novellus Systems, Inc., U.S. Appl. No. 11/602,128, filed Nov. 20, 2006.

U.S. Office Action mailed Aug. 16, 2006 from U.S. Appl. No. 10/742,006.

U.S. Final Office Action mailed Jul. 18, 2007 from U.S. Appl. No. 11/251,353.

U.S. Office Action mailed Nov. 30, 2006 from U.S. Appl. No. 10/690,084; 6 pages.

U.S. Office Action mailed Aug. 2, 2007 from U.S. Appl. No. 10/690,084.

Notice of Allowance mailed Oct. 2, 2007 from U.S. Appl. No. 10/690,084.

U.S. Office Action mailed Feb. 8, 2008 from U.S. Appl. No. 11/251,353.

Final Office Action mailed May 13, 2008 from U.S. Appl. No. 11/251,353.

Notice of Allowance mailed May 13, 2008, from U.S. Appl. No. 11/251,353.

U.S. Final Office Action mailed Jun. 12, 2008 from U.S. Appl. No. 11/586,394.

Mori et al., "Metal Capped Cu Interconnection Technology by Chemical Mechanical Polishing," VMIC Conference, 1996, 487-492.

Hu et al., "Reduced Electromigration of Cu Wires by Surface Coating," Applied Physics Letters, vol. 81, No. 10, (2002), 1782-1784.

E.G. Colgan, "Selective CVD-W For Capping Damascene Cu Lines," Thin Solid Films, 262 (1995), 120-123.

Enhanced Copper Metallurgy for BEOL Application, IBM Technical Disclosure Bulletin, vol. 33, No. 5, (1990), 217-218).

U.S. Office Action mailed Nov. 26, 2007 from U.S. Appl. No. 11/586,394.

Eugene J. O'Sullivan, "Electroless Deposition in Microelectronics: New Trend," (2000) Electrochemical Society Proceeding vol. 99-34, 159-171.

N. Petrov and Y. Shacham-Diamand, "Electrochemical Study of the Electroless Deposition of Co(W,P) Barrier Layers for Cu Metallization,", (2001) Electrochemical Soc. Proceedings vol. 2000-27, 134-148.

Wolf, Silicon Processing for the VLSI Era, (1995) Lattice Press, vol. 3, p. 648.

Aksu et al., "The Role of Glycine in the Chemical Mechanical Planarization of Copper," Journal of the Electrochemical Society, 149 (6) G352-G361 (2002), Department of Materials Science and Engineering, University of California, Berkeley, Berkeley, California 94720-1760, USA.

* cited by examiner

CAPPING BEFORE BARRIER-REMOVAL IC FABRICATION METHOD

CROSS REFERENCE TO RELATED PATENT APPLICATIONS

This application is a continuation of application Ser. No. 11/251,353 filed Oct. 13, 2005, titled "Capping Before Barrier-Removal IC Fabrication Process" by Jonathan D. Reid et al., which is incorporated herein by reference in its entirety and for all purposes.

This application is related to U.S. patent application Ser. No. 10/690,084, filed on Oct. 20, 2003, titled "Method For Fabrication Of Semiconductor Interconnect Structure With Reduced Capacitance, Leakage Current, And Improved Breakdown Voltage" by Daniel A. Koos et al.; U.S. patent application Ser. No. 10/317,373, filed on Dec. 10, 2002, entitled "Nitridation Of Electrolessly Deposited Cobalt," by Heung L. Park; U.S. patent application Ser. No. 10/235,420, filed on Sep. 3, 2002, entitled "Electroless Layer Plating Process And Apparatus" by Heung L. Park, et al.; U.S. patent application Ser. No. 10/742,006, filed on Dec. 18, 2003, entitled "Two-Phase Plating Of Cobalt Barrier Layers" by Steven T. Mayer et al.; U.S. patent application Ser. No. 10/609,518, "Liquid Treatment Using Thin Liquid Layer" by Steven T. Mayer et al., filed Jun. 30, 2003; and U.S. patent application Ser. No. 11/200,338, "Small-Volume Electroless Plating Cell" by Steven T. Mayer et. al, filed Aug. 9, 2005. Each of these applications is incorporated herein by reference in its entirety for all purposes.

BACKGROUND

This invention pertains to methods for producing capping layers for metal lines in integrated circuits. The use of diffusion barriers and capping layers to fully encapsulate copper lines within copper containing integrated circuits is an accepted strategy for limiting copper diffusion into surrounding insulating dielectric materials.

Generically, a diffusion barrier is a thin layer of material that is deposited at the interface between two materials to prevent diffusion from one material into the other. In a typical situation, the diffusion barrier exists at the interface between conductive and insulating layers in an integrated circuit and prevents metal diffusion into non-conductive areas. In modern ULSI processes, diffusion barrier materials line the trenches and vias provided in a dielectric layer during damascene processing. They are also used in "capping" layers that cover the "top" surfaces of deposited copper lines (i.e., the surfaces of the copper lines that are coplanar with the dielectric field regions).

Diffusion barrier materials should have low resistivity and adhere well to both dielectric material and metal (e.g. copper). Conventionally, diffusion barriers for copper comprise refractory metals and compounds of refractory metals since these metals have the requisite low resistivity, adhere well to copper and can maintain good barrier properties at high temperatures. Titanium, tantalum and tungsten metals and their nitrides are commonly used. More recently, other refractory metal compounds such as nickel, molybdenum, and cobalt have been investigated.

In addition to serving as a diffusion barrier, the capping layer can help mitigate the problem of electromigration. Electromigration is a material transport phenomenon resulting from the drift or movement of atoms under the influence of momentum imparted on the atoms of the metal lattice by electron scattering (sometime viewed as an "electron wind") that is created by very high current densities flowing in small wires. In electromigration, micro-voids form between the current-carrying medium (e.g., copper of the copper line) and the surrounding barrier or insulator as the metal atoms move with the flowing electrons ("downstream") the micro-voids move in the opposite direction ("upstream"). This ultimately creates areas of less metal in cross section and even relatively large voids in copper lines at, for example, regions near a via base. Electromigration micro-voids are most pronounced at interfaces with the copper line where adhesion is weakest. Because cobalt and some related transition metal elements provide particularly good adhesion to copper, these materials have been proposed and are being gradually accepted as capping layers in the industry. The alloying character of the metal is also believed to contribute to the reduction of the electromigration behavior, binding the metal at microscopic void areas such as grain boundaries.

SUMMARY

Disclosed are methods of forming a capping layer on conductive lines in a semiconductor device. In one aspect, the method is characterized by the following operations: (a) providing a semiconductor substrate comprising a dielectric layer having (i) exposed conductive lines (e.g., copper lines) disposed therein, and (ii) an exposed barrier layer disposed thereon; and (b) depositing a capping layer material on at least the exposed conductive lines of the semiconductor substrate. In certain embodiments, the method may also involve removing at least a portion of a conductive layer (e.g., overburden) disposed over the barrier layer and conductive lines to expose the barrier layer. In some cases, the conductive layer is recessed with respect to the top of the plane prior to depositing the capping layer. The conductive layer may be removed by, for example, chemical mechanical polishing, abrasive-free planarization, membrane mediated electroplanarization (MMEP), electropolishing, electrochemical mechanical polishing (ECMP), and/or wet chemical etching.

In certain embodiments, the method also involves selectively removing material from the exposed conductive lines prior to (b) to form recesses in the conductive lines. This may be accomplished by, for example, isotropically etching the conductive lines. In certain embodiments, selectively removing material involves chemically etching the conductive lines with an etchant comprising an oxidizing agent and a copper complexing agent under conditions where the metal would otherwise form a surface oxide (e.g., for copper, at a pH>5).

In certain embodiments, the capping layer material is deposited by electroless plating, electroplating, chemical vapor deposition, or atomic layer deposition. The capping layer may also be deposited by a combination of two or more these operations. In certain embodiments, the capping layer material comprises cobalt and the cobalt contains Ni, P, B, W, or combinations of these. In a specific embodiment, a cobalt capping layer is deposited by electroless plating. Depending on the type of process employed, the capping layer material may deposit selectively over the exposed conductive lines. Processes that deposit the metal selectively on the exposed conductor (e.g., copper) are appropriate in certain embodiments.

After the capping layer is deposited, the process may, in certain embodiments, involve planarizing the semiconductor substrate to remove some fraction of the capping layer material deposited in (b), while maintaining at least some of the capping layer material over the exposed conductive lines. The planarizing may be accomplished by at least one of chemical mechanical polishing, reactive ion etching, sputtering, wet chemical etching, membrane mediated electroplanarization, electropolishing, and electrochemical mechanical polishing.

Also disclosed are methods characterized by the following operations: (a) providing a semiconductor substrate comprising a dielectric layer having (i) exposed dielectric field regions (which may or may not be covered with a conductive or insulating diffusion barrier layer), and (ii) exposed conductive lines disposed therein and being recessed below the dielectric field regions; (b) depositing a capping layer material on at least the exposed conductive lines of the semiconductor substrate by electroless or electrolytic deposition; and (c) removing at least excess deposited capping layer material. In certain embodiments, the exposed dielectric field regions provided in (a) comprise a barrier layer disposed thereon. Examples of such barrier layer include tantalum, titanium, tungsten, nitrides of these and other metals, and combinations thereof.

Also disclosed are methods characterized by the following operations: (a) providing a semiconductor substrate comprising a dielectric layer having (i) exposed dielectric field regions (which may or may not be covered with a diffusion barrier layer), and (ii) exposed conductive lines disposed therein and being recessed below the dielectric field regions; (b) depositing a cobalt capping layer material on at least the exposed conductive lines of the semiconductor substrate; and (c) removing at least excess deposited cobalt capping layer material. As with the above-described methods, the exposed dielectric field regions may comprise a barrier layer.

Another aspect of the invention pertains to a method characterized by the following: (a) providing a semiconductor substrate comprising a dielectric layer having (i) copper lines disposed therein, (ii) a barrier layer on at least field regions of the dielectric layer, and (iii) copper overburden covering the copper lines and barrier layer; (b) removing said copper overburden by a technique other than an isotropic wet etch to a point prior to exposing the barrier layer; (c) isotropically wet etching the remaining overburden to expose the barrier layer and selectively remove material from the copper lines to form recesses in the copper lines while providing an exposed barrier layer on field regions of the dielectric layer; and (d) depositing a capping layer material on at least the recessed copper lines of the semiconductor substrate. These operations may be followed by a further operation of thinning the semiconductor substrate after (d) to remove some fraction of the capping layer material deposited in (d), while maintaining at least some of the capping layer material over the exposed copper lines.

Also disclosed are apparatus for forming a capping layer on conductive lines in a semiconductor device. In one aspect the apparatus may be characterized by the following features: (a) a first polishing, etching, or planarization tool configured to deposit a planar copper film or remove overburden from a semiconductor substrate comprising a dielectric layer; (b) a capping layer material deposition tool for depositing the capping layer material on at least the exposed conductive lines produced by the polishing or planarization tool; and (c) a second polishing or planarization tool configured to remove excess capping layer material deposited (e.g., along with dielectric) by the capping layer deposition tool. In certain embodiments, the first polishing or planarization tool, the capping layer material deposition tool, and the second polishing or planarization tool are integrated in a single unit.

In certain embodiments, the apparatus also includes a wet chemical etching tool. This tool may be capable of selectively removing material from the field over the dielectric and the exposed conductive lines to form recesses in the conductive lines. Commonly, at least one of the polishing or planarization tools is a chemical mechanical polishing tool, but tools for other techniques or combinations thereof such as ECMP, planarized plating, MMEP and wet etch can also be used. In certain embodiments, the capping layer material deposition tool is an electroless or electrolytic deposition tool.

The first polishing or planarization tool may be configured to produce (i) exposed conductive lines disposed in the dielectric layer, and (ii) exposed dielectric field regions (which may or may not be covered with a diffusion barrier layer). In certain embodiments, the first polishing or planarization tool is configured to leave a barrier layer in tact on top of the exposed dielectric field regions. Note that the apparatus may also include an electroplating module for depositing conductive lines. The plating module may be configured to deposit a planarized layer of copper or other conductive material.

These and other features and advantages of the invention will be further described below in conjunction with the associated drawings.

DETAILED DESCRIPTION OF A PREFERRED EMBODIMENT

Introduction

Figure 1A:
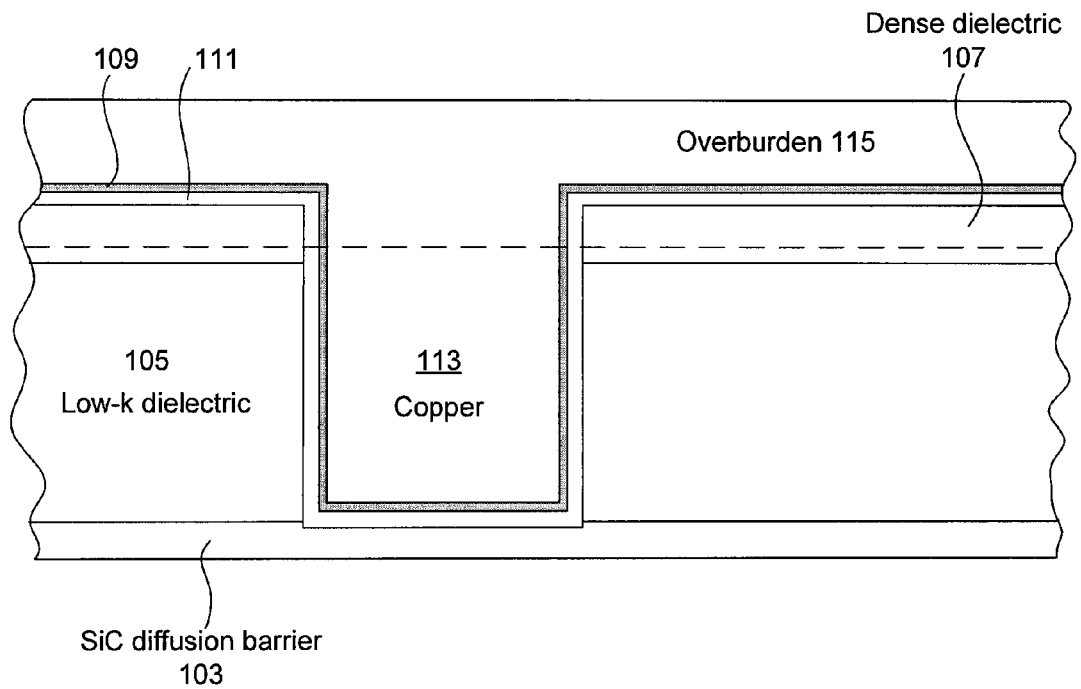
FIGS. 1A through 1E present a series of five cross sectional diagrams of a metallization layer stack depicted at various stages associated with capping layer formation.

Methods of forming capping layers employ one or more of the following features or operations: (i) depositing the capping layer on a substrate having an exposed diffusion barrier layer on the dielectric field regions, (ii) recessing conductive lines in the dielectric layer prior to depositing the capping layer, (iii) employing cobalt or nickel and alloys of these materials including phosphorous, boron and/or tungsten as the capping layer, (iv) depositing the capping layer by electroless and/or electrolytic plating, and (v) planarizing the substrate to remove excess deposited capping layer material. Note that none of these operations alone are essential to the invention. The invention can be practices using various combinations of the listed operations.

Recessing the conductive lines in the dielectric layer is useful because it allows for a subsequent barrier removal and/or dielectric planarization step which clears any capping layer that would have deposited on the field regions while preserving the capping layer in the recesses above the conductive lines. Note that barrier removal and/or dielectric planarization is conducted in some conventional processes when previous processing steps have left the substrate with insufficient planarity or completeness. Dielectric planarization removes an upper portion of the dielectric layer in the field regions. If the conductive lines were not recessed such that the capping layer is deposited in the recesses below the level of the dielectric field regions, the dielectric planarization step could remove all of the capping layer on the conductive lines.

Maintaining an exposed diffusion barrier layer on the field regions of the dielectric during capping layer deposition provides various benefits. In processes where the capping layer is deposited by electroless plating, for example, the presence of the barrier layer helps overcome the phase formation energy barrier associated with nucleation in the electroless deposition process. Generally the nucleation of the capping material is kinetically limited (hindered), but after nucleation, the process can take place at a lower voltage. By electrically connecting the individual and isolated lines, it has been found to greatly enhance the consistency of the nucleation and growth processes. It also provides a greater surface area driving force in comparison to the case where the exposed conductive lines are the only conductive structures on the face of the substrate but still provides electrical communication with nearby lines to enable and drive the deposition half reactions over larger "connected" active regions. We have found that this electrical connectivity of the lines though the oxide covered metal barrier layer can facilitate nucleation, particularly on small isolated features. Without this connection and under similar conditions, such features are found to not nucleate and hence are not be covered by the capping material. Note however that, while useful in itself, certain embodiments of the invention do not require that the diffusion barrier remain intact during the capping layer deposition process.

Comparative Example Based on Conventional Processes

For comparison purposes, a process representing certain aspects of current industrial processes for forming capping layers will now be described. This description is not to be construed as an admission of prior art.

Initially, in the comparison process, a chemical mechanical polishing (CMP) procedure is employed in one or more separate steps to remove excess copper on the active surface of a semiconductor substrate (e.g., a 200 mm or 300 mm wafer comprising partially fabricated integrated circuits). The excess copper, frequently referred to as "overburden," results from an electroplating operation employed to form the copper lines. It covers both the copper lines and the dielectric field regions on the partially fabricated semiconductor substrate. The goal of the CMP operation is to provide a flat substrate surface having an exposed dielectric layer with copper lines embedded therein.

Commonly, a multi-step CMP process is employed in which each step uses a slightly different type of slurry, pads, pressures, and other operating conditions, optimized for the particular material encountered during CMP. For example, to remove copper overburden, an initial CMP process may be optimized for copper planarization, copper removal, and minimization of dishing of metal removal at the end of the copper CMP step. Thereafter, when the copper has been removed, the CMP conditions may be optimized to clear a diffusion barrier layer, which coats the field regions of the dielectric, removal of the dielectric and some copper in the features, and correct for underlying topography or earlier generated dishing. The barrier layer is typically a transition metal or transition metal nitride such as tantalum, tantalum nitride, titanium, titanium nitride, etc. The barrier removal CMP step may employ one or more unique slurries and possibly even a separate CMP station. After the barrier has been removed, the actual dielectric material is exposed. The dielectric may be multilayered (e.g. with a mechanically stronger, higher dielectric constant material over a weaker lower dielectric constant material). In some processes, where further planarization is required, some amount of dielectric is removed. If such process is required, a CMP method optimized to remove dielectric material together with embedded copper in the copper lines is provided. In many cases, such process is biased toward mechanical removal, with less emphasis on chemical removal, with the chemical process tuned to match the mechanical removal considering the various components found in the layer (dielectric and copper).

The CMP slurry employed in these various steps typically includes aggressive etchants as well as anti-corrosion agents, etc. Some of these components have a strongly deleterious impact on operating performance of the dielectric layer. Therefore current industrial processes may include a number of post-CMP cleaning operation. In a typical case, this involves an initial brush clean and or megasonic clean of the surface to remove residual CMP particles on the surface. Thereafter, a chemical rinse or ion exchange is performed to extract metal ions, anti-corrosion agents, etc. from within the dielectric matrix. Metal ion exchanging and complexing agents may be employed for this purpose; various commercially available compositions are available such as compositions from ATMI, Inc. of San Jose, Calif.

Next in the process, the substrate must be rinsed and dried without leaving surface residuals. This can present a particular challenge for modern porous dielectric materials, which are often highly hydrophobic. To reduce the surface tension of the rinse fluid, an advanced vapor drying process may be employed. Such processes may be implemented in apparatus available from, for example, SCP Global Technologies of Boise, Id.

After the substrate has been dried, the semiconductor substrate is transferred to a separate processing module, where copper lines are capped with cobalt by an electroless deposition process. During the transfer, the wafer is exposed to ambient conditions which can oxidize exposed copper lines.

Once the substrate is in place in the capping layer deposition module, the partially fabricated semiconductor substrate is pre-treated to remove oxides, etc. that may have formed on the copper during the transfer. In some cases, the pre-treatment includes separate steps of cleaning the surface and then activating the copper for electroless deposition of cobalt. The surface clean operation may be performed with an acid or other treatment that reduces any oxides formed on the copper surface, as well as removing any organics or other contaminants that may still reside on the copper surface. The activation step is optional, depending upon the electroless deposition chemistry and processing conditions. In one example, activation is accomplished by depositing a thin layer of palladium on the exposed copper lines. It is generally known that cobalt deposits much more reliably on copper treated with palladium or other noble metals (e.g., platinum, ruthenium, etc.) than on copper without such treatment due to the superior catalytic properties of the palladium for the reducing agents oxidation. Other activation steps sometimes used in conventional processes rely on particular cobalt chemistries and process conditions that facilitate nucleation and initiation of the cobalt deposition process. Once a base layer of cobalt has been successfully deposited, subsequent deposition proceeds relatively smoothly, as the cobalt deposition process is autocatalytic.

The technologies currently employed to deposit the cobalt capping layer are somewhat selective for the exposed copper lines. In other words, the cobalt deposits principally on the copper lines and not on the surrounding dielectric field regions. In a typical example, cobalt is selectively deposited from an electroless plating solution maintained at a relatively high temperature (e.g., about 80° C.) and at a relatively high concentration of cobalt (e.g., about 30 g/l cobalt). To the extent possible, the electroless deposition process is controlled so that only a relatively thin layer of cobalt is deposited. This is because the conductivity of cobalt is significantly lower than that of copper. Unfortunately, it is difficult to electrolessly deposit a very thin (e.g. <200 Å), continuous, hermetic, high quality cobalt film, as uniform cobalt nucleation is so difficult to achieve over the entire surface of a wafer. Also complicating matters is the need to initiate deposition on all lines at similar rates. It is found that isolated, small lines can nucleation and grow at much slower rate than larger lines or area of arrays of smaller lines. The electroless cobalt deposition step presents additional problems. For example, the hot aggressive electroless solution tends to drive cobalt, amines, and possibly other deleterious bath components into the low-k dielectric material. At a minimum, this requires careful cleaning of the dielectric after the process is concluded, and even with such cleaning, the quality of the dielectric (in terms of, for example, breakdown voltage) can be seriously comprised. After the deposition process is complete, the wafer must be appropriately cleaned. Some of the cleaning steps are identical to or resemble those at the conclusion of the CMP phase of the process. Initially, in a conventional process, a buff or megasonic clean is employed to remove particulates from the substrate surface. Thereafter, the dielectric is chemically treated to remove those ions that might degrade its quality, e.g., cobalt ions left over from the electroless plating operation. As indicated above, an ion exchange chemistry employing suitable metal complexing agents can be used to penetrate into the dielectric and extract deleterious metal ions. After the surface is chemically treated as described, the wafer is rinsed and dried as described above employing, e.g., an advanced vapor dryer.

From the above, it can be seen that there are various difficulties with the conventional processes for forming a capping layer on copper lines in a metallization layer. In particular, the electroless deposition of cobalt can strongly degrade the quality of a low-k dielectric film. Further, the process requires at least two separate cycles of cleaning, including removal of surface particulates, treatment with ion exchange compositions, and rinse/dry. Still further, electroless processes have difficulty forming a thin uniform layer of cobalt. Finally, uniform nucleation on all lines is very difficult to achieve and control.

Embodiment of the Invention

A specific embodiment of the invention will now be described. The process begins with a wafer comprising partially fabricated semiconductor devices. The wafer includes a dielectric layer with inlaid copper conductive lines and copper overburden disposed over top of the dielectric field regions. The first operation in the process removes excess copper overburden and/or planarizes the surface of the wafer. This process may be accomplished using a copper-optimized CMP or AFP procedure (or MMEP, wet etch, ECMP, etc.). AFP refers to an abrasive-free planarization technique. Such techniques resemble CMP but have little if any abrasive content in the polishing slurry. As an alternative, a wet etch may be employed to remove some or all of the copper overburden. If a wet etch is employed for this purpose, it may be preferable that the substrate is already substantially planar (e.g. processed by a planarization technique such as selective accelerative plating (SAP), planar plating, CMP, ECMP or MMEP).

Using one or more of CMP, AFP, wet etching, or another suitable process, the overburden is removed to a point where the diffusion barrier layer is encountered on the field regions of the dielectric. In this exemplary embodiment, the process conditions are chosen such that at least some of the diffusion barrier layer remains in place over the dielectric field regions. This may require the use of a selective material removal process such as a copper selective CMP process or wet etch.

After removing overburden to the point of exposing (but not completely removing) the barrier layer on the field regions of the dielectric, the exposed copper lines are selectively etched to produce recesses. Suitable methods for etching recesses in the exposed copper lines include, for example, isotropic wet chemical etching employing an etchant solution containing an oxidant and a metal complexing agent. In a specific embodiment, the recess extends approximately 1,300 Angstroms below the field regions of the surrounding dielectric. Note that the barrier layer in place over the dielectric protects the dielectric during exposure to the etching solution including along the sidewalls of the lines or vias previously covered by copper.

After etching, the process can proceed directly to deposition of a cobalt capping layer. The etching will have served to clean the surface with little, if any, contamination of the dielectric and exposed copper lines. Megasonic energy combined with wet etching is also useful. Nevertheless, to prevent formation of oxide on the exposed portions copper lines, it may be desirable to maintain a layer of water on the surface of the wafer substrate.

At this point, the metal (e.g. cobalt) capping layer is deposited from an electrolytic or electroless solution. The metal is deposited to a thickness of approximately 200 to 1800 Angstroms, e.g., 400 to 1300 Angstroms in a 65 nanometer technology node process. As indicated above, the process may be substantially selective so that little if any of the cobalt deposits outside the recessed copper conductive lines. Because the lines are electrically connected though the unoxidized portion of the underlying barrier metal or metal nitride, external (electrolytic) and internal (electroless) current flow is possible on both global and local scales.

Next, the wafer is exposed to CMP to remove at least the barrier layer and some of the deposited cobalt. If additional planarization is required, the CMP operation may proceed beyond this and remove some portion of the dielectric together with further amounts of cobalt. These steps are sometime referred to as barrier CMP, oxide CMP, barrier-oxide CMP, or other names, but it is understood that the process first removes the barrier at the top of the dielectric, and then (if desired and allowed to continue) removes both the dielectric between the metal of the lines and the metal in between the dielectric, found in the damascene trenches and vias. In the processes described herein, the barrier/oxide CMP process is optimized to remove the metal capping layer in these trenches and vias, but not the current carrying metal of the lines and vias (typically copper). At the end of the process, a thin continuous layer of high quality cobalt is provided over all copper lines. This CMP operation mitigates difficulties caused by uneven and/or non-selective deposition of cobalt on the substrate surface. By first forming an initially thick capping film inside the trench, and subsequently removing the uppermost layers of the film during the barrier/oxide CMP process, the process creates a good hermetic capping layer coating.

Thereafter a megasonic clean and/or brush-buff clean is performed to remove slurry particles from the surface of the substrate. Then, an ion exchange operation as described above may be employed to extract metal ions and other materials introduced into the dielectric during the CMP operations. After this cleaning is complete, the substrate is rinsed and dried, optionally employing an AVD (Advanced Vapor Dry) process as described above.

Note that in this embodiment of the invention, the surface is only cleaned once, as compared to the two separate cleans required in the conventional process described earlier. Further, during the cobalt deposition process the barrier in place over the dielectric protects the dielectric from the aggressive electroless cobalt deposition solution. Further, as explained elsewhere, the barrier layer facilitates highly selective electrolytic and (importantly but surprising) even highly selective electroless deposition of uniform capping (e.g. cobalt) layers.

Metallization Layer Stack

In certain embodiments, the basic stack of a damascene metallization layer employed as a starting point in processes of this invention will include a dielectric layer with inlaid copper lines, a diffusion barrier on top of the field regions of the dielectric, and copper overburden above the entire structure. FIG. 1A depicts a typical example of such stack. The depicted metallization layer includes an underlying silicon carbide diffusion barrier 103 at the bottom of the stack, a porous low-k dielectric 105 forming the bulk of the metallization layer on top of barrier 103, and a thin layer of dense dielectric 107 on top of the porous dielectric to protect the underlying porous dielectric. Further, a diffusion barrier is formed as a bilayer of, e.g., tantalum nitride 109 and tantalum 111. Note that the barrier bilayer 109/111 also forms on the bottom and vertical walls of the trenches and vias in which the copper is deposited. As indicated, a function of the diffusion barrier is to keep copper out of the dielectric as the overburden is being plated and during subsequent processing to remove the overburden. Examples of diffusion barrier materials that may be employed with this invention include titanium, titanium nitride, tantalum, tantalum nitride, tungsten, tungsten nitride, silicon nitride, silicon carbide, silicon nitri-carbide, silicon carbo-nitri-oxide, etc.

Figure 1B:
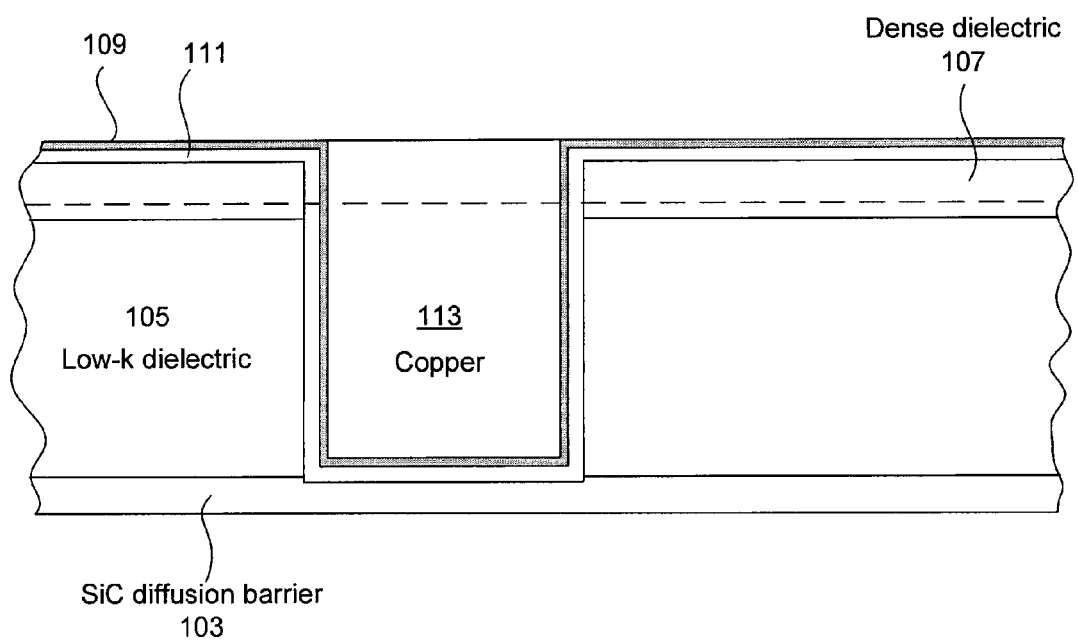

As shown in FIG. 1A, a copper line 113 occupies a trench in the metallization layer and copper overburden 115 covers the field regions. The copper overburden can be removed in any of a number different conventional ways. Three will be described here for the sake of illustration. The chosen technique removes the overburden to the point of reaching the barrier and produces a planar surface with exposed conductive lines and barrier covered dielectric field regions. A representative metallization stack is depicted in FIG. 1B, where the reference numbers employed in FIG. 1A still apply.

The first technique employs a chemical mechanical polishing operation that is selective for copper but not barrier material. An abrasive-free CMP process may be appropriate for this purpose. See for example U.S. patent application Ser. No. 10/942,302 filed on Sep. 15, 2004 naming Wu, et al. as inventors, which is incorporated herein by reference for all purposes. In a specific embodiment, a CMP (preferably abrasive-free CMP) process follows a selective acceleration planarization (SAP) deposition process as described in U.S. patent application Ser. No. 10/739,822 filed Dec. 17, 2003 and naming Mayer and Drewery as inventors, which is incorporated herein by reference for all purposes. Other techniques for planar plating may also be employed. A second method for removing overburden employs a wet etch process that is selective for copper but not barrier or dielectric. In order to use this process for removing the overburden, it may be necessary to begin with a planarized overburden layer. In one embodiment, such planar overburden layer is produced by a planar plating process such as an SAP process described in the above-mentioned U.S. patent application Ser. No. 10/739, 822. Preferably the wet etch is an isotropic etch produced using an etchant containing, e.g., an oxidizing agent and a copper complexing agent. In certain embodiments, the etchant not only removes the overburden but also produces recessed copper lines as described hereinafter. Examples of suitable etchants for this purpose are described in U.S. patent application Ser. No. 10/690,084, filed Oct. 20, 2003, and naming Koos, et al. as inventors, which was previously incorporated by reference.

A third technique for overburden removal employs a combination of CMP and a wet chemical etch. In this embodiment, CMP is employed to remove most of the overburden, almost clearing all of the copper from above the barrier and dielectric. When the CMP component of the operation is concluded, the substrate is exposed to a wet etchant such as that described in the above-referenced U.S. patent application Ser. No. 10/690,084 to remove the remainder of the overburden and, in certain embodiments, selectively remove some copper to produce recesses in the copper lines as mentioned above and described hereinafter. Again, the etchant preferably comprises an oxidizing agent and a copper complexing agent.

Figure 1C:
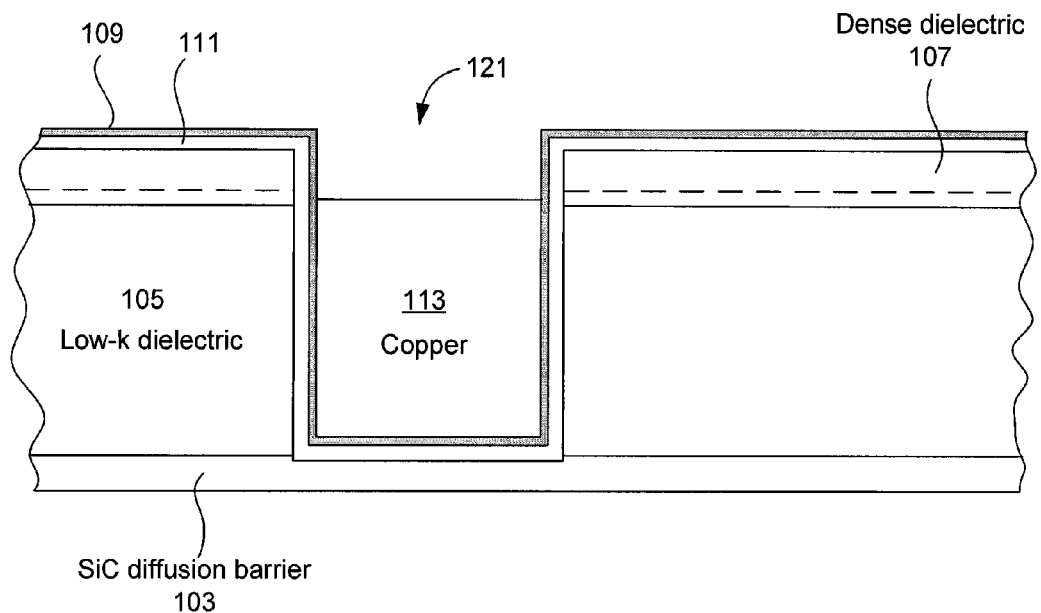

Other techniques may be employed for removing overburden. These include electrochemical mechanical polishing (ECMP) and membrane mediated electrochemical planarization (MMEP). MMEP is described in, for example, published PCT application WO 2005/042810, filed Nov. 1, 2004 and naming Mazur et al. as inventors, which is incorporated herein by reference for all purposes. Note that after the overburden is removed to the point where only the barrier layer material is exposed in the field regions of the dielectric, the process continues by optionally etching some of the copper in the exposed dielectric lines back to a level below the barrier/dielectric field regions. As explained in two of the overburden removal examples above, that overburden removal process may itself produce recessed copper lines, although is not a necessary result of these processes. For example, the overburden removal wet etch may produce a planar surface with exposed barrier/dielectric field regions and a different wet etch may produce the recessed copper lines. Regardless of how the recesses are produced, the resulting structure may resemble that shown in FIG. 1C, where a recess 121 is depicted.

A specific example of an etchant suitable for forming recesses in the copper lines will now be described. In this example, the chemical agent has a pH that is nearly neutral (neither highly acidic nor highly basic). In a specific embodiment, the pH is between about 5 and about 10. As mentioned, the etchant may include an oxidizing agent. Specific examples of such oxidizing agents include peroxide, ozone, oxygen, persulfate, and permanganate. Examples of copper complexing agents employed in the chemical etchant include glycine, ethylenediamine tetraacetic acid (EDTA), citric acid and salts thereof, maleic acid and salts thereof, and certain ammonium and ammonia/amine compounds known to those of skill in the art.

Any number of suitable techniques may be used to contact the conductive lines with the etching solution. These techniques can include, but are not limited to, immersing, spraying, spin on contact, and the like. In one example, apparatus for applying etching solution includes an EBR (edge bevel removal) module or SRD (spin rinse drier) module. Examples of suitable apparatus and methods for applying etchant are described further in U.S. Pat. No. 6,309,981 and in U.S. Pat. No. 6,586,342 issued Jul. 1, 2003 to Mayer et al., both of which are incorporated herein by reference for all purposes. In a specific embodiment, the etching solution is sprayed onto a rotating substrate that is rotated between about 20-200 rpm at ambient temperatures.

In a particular embodiment, at a point after the surface is substantially planarized by one of the techniques discussed above, but before the metal has been removed (cleared) to the barrier, isotropic wet etching is employed. It may be desirable to employ the isotropic wet etch prior to the exposure of the barrier material because it is know that continued processing using techniques such as CMP, ECMP, MMEP, and electropolishing generate dishing and erosion of metal inside the features. Furthermore, the amount of dishing and erosion is also known to vary as a function of feature size, feature density, location, and other geometric parameters. This makes it challenging to create the same or even similar degrees of recess for all feature sizes and densities, and over the entire wafer. Filling structures recessed to varying degrees with a capping material results in a large variability in the capping layer thickness. Therefore, one embodiment terminates the planarization and copper removal process with metal still above the trenches and vias, an then clears the metal over these features to the plane of the field area (top of the dielectric).

Then, in some embodiments, the same or another formulated isotropic etch metal removal is continued, uniformly removing metal from within the trenches and vias of all features and creating an essentially equal "space" or depth within the trenches and vias to be subsequently filled with capping metal. The isotropic etch may be performed over the whole wafer at once (i.e., in a global manner), or sequentially over a portion of the wafer, by using, for example, one or more separately activated spray nozzle, a sweeping or movable "stylus" applied nozzle, materials and apparatus for "quenching" or diminishing etch rate at some areas of the wafer upon reaching a desired endpoint, a sequential combination of these, or any other process or processes. The aim of these isotropic etch steps is to create substantially equal amounts of metal removal from the embedded lines, independent of feature location, size, density or other geometric parameters.

The thickness of copper etched back below the level of the field regions depends upon various considerations such as how thick the capping layer must be at the end of the process and how much dielectric will be removed in a subsequent dielectric planarization operation, assuming such operation is employed. Note that if the substrate at the beginning of the process is highly planar, the process may not need to remove any dielectric material, or at least only a relatively small amount of such material, to effect planarity. In a specific embodiment in the 65 nanometer technology node, the etch back produces a recess in the copper lines of approximately 1300 angstroms. More generally, embodiments of the invention etch the copper by between about 100 and 2000 Angstroms, though larger and smaller amounts are certainly possible.

As indicated, the etch may be an isotropic etch that is conducted for a defined period of time to create a recess of a defined depth. It may produce clean vertical sidewalls defined by the dielectric trench or via. Further, the etched top surface of the copper or other conductive material may be substantially flat, from one sidewall to the others. In certain embodiments, the etching is not conducted with a pad or an abrasive medium and the resulting etched surface is not "dished."

Figure 1D:
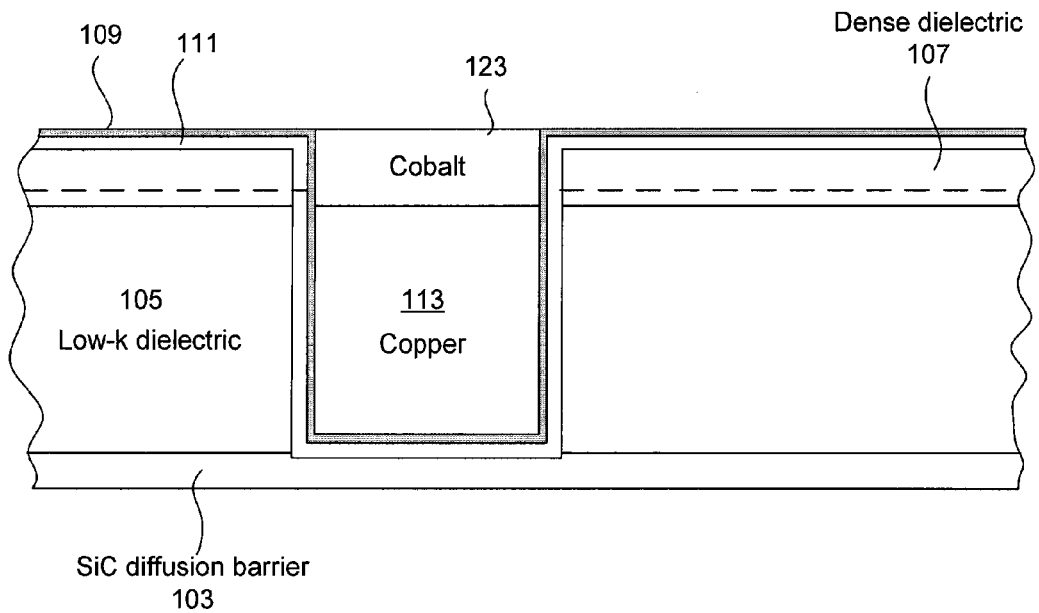

After etching, the next operation in the procedure involves depositing the capping layer. A representing metallization layer stack resulting from this process is depicted in FIG. 1D, where the deposited capping layer material is depicted by reference number 123. FIG. 1D shows that the cobalt is selectively deposited over the exposed copper line. In a typical electroless deposition process, the selectivity is not perfect and some cobalt usually deposits over the field regions (for example, by directly electrolessly reducing there, or by the migration of particles). To address this issue, the cobalt deposited over the field regions may be removed in a subsequent planarization operation as described below.

While many embodiments described herein employ cobalt as the capping layer material and electroplating or electroless plating as the deposition technique, the invention is not so limited. Examples of capping layers that can be deposited by electroplating, and in some cases electroless plating include cobalt, nickel, molybdenum, alloys of any of these, and compositions including boron, phosphorus, and/or tungsten with any one or more of these. Other materials that can serve as the capping layer, but are not necessarily platable (electrolytic and/or electrolessly) in aqueous electrolytes, include tungsten, tantalum, tantalum nitride, titanium, titanium nitride, vanadium, and the like. Some of these may be deposited using organic or inorganic (but non-aqueous) electrolytes (examples include propylene carbonate, ethylene carbonate, dimethylsulfoxide, dimethylcarbonate, dimethylformamide, supercriticial carbon dioxide, ammonia, etc). As indicated, deposition processes include electroplating and electroless plating. Other techniques that may be suitable in some embodiments include chemical vapor deposition (e.g., selective CVD of tungsten), atomic layer deposition (and numerous variants thereof such as pulsed nucleation layer (PNL) deposition processes), selective reduction of an organometallic precursor from an inorganic or supercritical solution including carbon dioxide for example, physical vapor deposition, and the like.

As discussed earlier, certain embodiments of the invention involve depositing the capping layer on a substrate in which the barrier layer is still intact on the dielectric field regions. An intact barrier layer may provide various benefits. It may chemically protect the underlying dielectric from aggressive chemicals and conditions employed during deposition of the capping layer. Further, a conductive barrier layer facilitates electroplating of the capping layer (assuming that electrolytic or electroless plating is employed to deposit the capping layer). The barrier layer, particularly a metallic barrier layer, can carry current for the electroplating operation.

It has been found that in some cases, a combination of electrolytic and electroless operations can be employed. For example, in a preferred embodiment, the capping process is performed using an electrolytic plating solution and apparatus containing the capping metal ion. In some certain embodiments, the electroless plating solution is a solution used for electroless deposition of the metal, but that exhibits little or no catalytic activity for initiating deposition on imbedded conductive metal (e.g. copper). Such solutions often require the use of activating agents (such as Pd, Pt, Ru, etc.) to initiate the electroless deposition process, and are deposited onto the metal (e.g. copper) line via a displacement reaction of the less noble metal by the more noble activating metal. However, activation in this way can cause pitting in the line and other undesirable effects. Therefore, after immersion of the surface into an apparatus having 1) electrical contracts connecting to the barrier layer, 2) a counter electrode (either consumable or dimensionally stable), and 3) a power supply, a short electrical electrolytic current is applied across this electrolytic cell to induce nucleation and deposition of a small amount of capping material (e.g. cobalt). Once this small amount of metal has been deposited, the electric current is removed the process can proceed using an electroless plating solution. This "nucleation-strike" process is not possible without the barrier/metal still in tact to carry the electronic current to the lines on the surface, and enables the use of otherwise unusable (but often more stable and less expensive) solution for the plating operations.

In the case of electroless plating, a conductive barrier layer is also believed to permit electron transport and "electronic communication" between individual lines where the electroless deposition takes place. Therefore, lines and close proximity are maintained at the same potential. Because of this electronic communication and consistence of potential, the half reactions at the individual electronic lines are tied together across the multiple lines and may ameliorate local difficulties in achieving nucleation at certain lines on the substrate. For example, the difficulty in initiating plating onto very small isolated line is seen to be substantially eliminated. Still further, the barrier layer may facilitate selective deposition of the capping layer on the conductive copper lines but not on the field regions. This may be due to the spontaneous formation of a native, non-reducible and kinetically inhibiting oxide layer over an underlayer of metal. In certain embodiments, the invention is practiced so that the deposition is substantially selective for the copper conductive lines.

In certain embodiments, the barrier layer forms a "non-reducible oxide" which resists reduction during electrolytic or electroless deposition. When such barriers are employed, the capping layer deposition is highly selective for the copper lines. Examples of barrier materials that form a suitably non-reducible oxide in water or air include tantalum, titanium and tungsten.

Obviously, the range of apparatuses employed to accomplish a capping layer deposition can vary widely depending upon the type of deposition process employed. For the most part, conventional electroless, electrolytic, CVD, ALD, PVD, and other widely deployed processes can be conducted using substantially conventional tools, including those now in existence and those developed in the future for these purposes. In certain embodiments employing electroless deposition, the apparatus employs a thin liquid layer for cobalt deposition. An example of such apparatus is described in U.S. patent application Ser. No. 10/609,518 filed Jun. 30, 2003, which is incorporated herein by reference for all purposes. See also U.S. patent application Ser. No. 10/609,518, "Liquid Treatment Using Thin Liquid Layer" by Steven T. Mayer et al., and U.S. patent application Ser. No. 11/200,338, "Small-Volume Electroless Plating Cell". By Steven T. Mayer et. al, both previously incorporated by reference.

In conventional electroless cobalt deposition processes, it has been found that it can be difficult to deposit continuous layers of very thin cobalt on copper conductive lines. This is due in part to the difficulty in accomplishing nucleation of the cobalt deposition layer on copper. Once the nucleation layer is formed, the reaction proceeds on the cobalt nucleation layer auto-catalytically, and therefore proceeds relatively rapidly at the nucleation sites. However, in other regions where nucleation has not taken place or has not occurred as rapidly, little or no cobalt may be deposited by the time the early nucleating regions of the copper lines have reached an optimal or maximum cobalt thickness. By the time the various cobalt deposition sites coalesce on top of all the copper lines, the local thickness of cobalt may be too great in certain regions. As mentioned above, the present invention does not suffer from this difficulty as it employs a separate step for removing excess cobalt (or other capping layer material) after the deposition process is completed. Before this step is described, additional details of an electroless deposition processes will be presented.

In the case of a cobalt capping layer, the electroless deposition solution may include cobalt ions together with an appropriate reducing agent such as N,N-dimethylamine borane (DMAB) or a source of hypophosphite ion such as ammonium hypophosphite (AHP). As is known in the art, the electroless deposition process can be activated with using a borane or using palladium displacement (e.g., using a $PdCl_2$ activator) for example.

In one approach, the capping layer is formed using a two-phase method, which involves forming a metal nucleation layer on the etched metal portions of the substrate and then forming a bulk metal layer on the metal nucleation layer. See U.S. patent application Ser. No. 10/742,006, previously incorporated by reference. The two phases of deposition process take place at different times, although some overlap is possible and even preferable in some embodiments.

In the first phase of the two-phase approach, a thin conformal nucleation layer is selectively deposited on the exposed metal surfaces but not on dielectric/barrier regions of the substrate. The metal nucleation layer provides a "seed" for the subsequently deposited bulk metal layer. Generally, the nucleation electroless bath is an aqueous solution including a source of metal ions and a reducing agent. In certain embodiments in which a cobalt capping layer is deposited, the nucleation electroless bath contains a cobalt ion source and a borane compound reducing agent. The bath may also include one or more other components such as a stabilizer (a kinetic inhibitor or catalytic poison such a benzotriazole, BTA, to maintain the thermodynamically unstable bath), a complexing agent (prevents too much free metal ion), a buffer (to keep pH range narrow), a pH adjustor, and/or one or more surfactants. Typically, the thickness of the nucleation layer (seed) is less than about 50 angstroms, and in certain embodiments between about 5 and 10 angstroms. The process can be monitored using a reference electrode that indicates when a complete layer of cobalt has been deposited.

In the second phase of the two-phase approach, a bulk metal layer is deposited on the nucleation layer. The bulk metal layer acts as the main barrier for preventing copper diffusion and is generally thicker than the nucleation layer. In the case of cobalt, for example, the bulk deposition process is autocatalytic; i.e., the kinetics favor metal deposition on a solid capping layer metal surface. In addition, the process employs a relatively inexpensive and more stable reactant such as hypophophite (e.g. ammonium hypophosphite) as a reducing agent.

As indicated, the capping layer may comprise any one of various refractory metals such as cobalt. The capping layer may also contain other materials that may be impurities or purposefully added components such as tungsten, boron, phosphorus, titanium, tantalum, zinc, cadmium, molybdenum and/or lead. These additional materials may form an alloy with the metal. Or they may serve as dopants in the metal. Or they may form a non-equilibrium mixture with the metal. Preferably, the additional materials fill or "stuff" the metal grain boundaries with amorphous material and thereby block natural diffusion paths. This of course improves the barrier properties of the metal capping layer. The metal (with or without such additional material) may exist in various morphologies such as amorphous or polycrystalline morphologies.

The capping layer may fill most or all of the etched recess. Typically, it is not merely form a thin layer or additional barrier on which additional capping material is deposited. In certain embodiments, the capping layer is formed directly on the recessed metal surface, without any intervening deposition operation such as deposition of additional barrier. As indicated, electroless or electrolytic plating are suitable techniques for forming the capping layer, which fills most or all of the recessed region in a trench or via.

As indicated, processes of this invention may include a step of removing excess capping layer material after the capping deposition process. However, before the excess capping layer material is removed, the process may optionally include an anneal. In a specific embodiment, the anneal is conducted at a temperature of between about 200 and about 500° C. for a period of time between about 2 and about 60 minutes. The anneal is optionally employed to drive a small amount of cobalt (or other capping layer material) into the underlying conductive copper lines to effect improved adhesion between the capping layer and the copper lines and thereby provide additional protection against electromigration. While some metal diffusion to the conductor (copper) may be beneficial, care should be taken to ensure that the amount of capping layer material driven into the copper lines is limited so as not to unduly decrease the conductivity of the conductive lines.

Figure 1E:
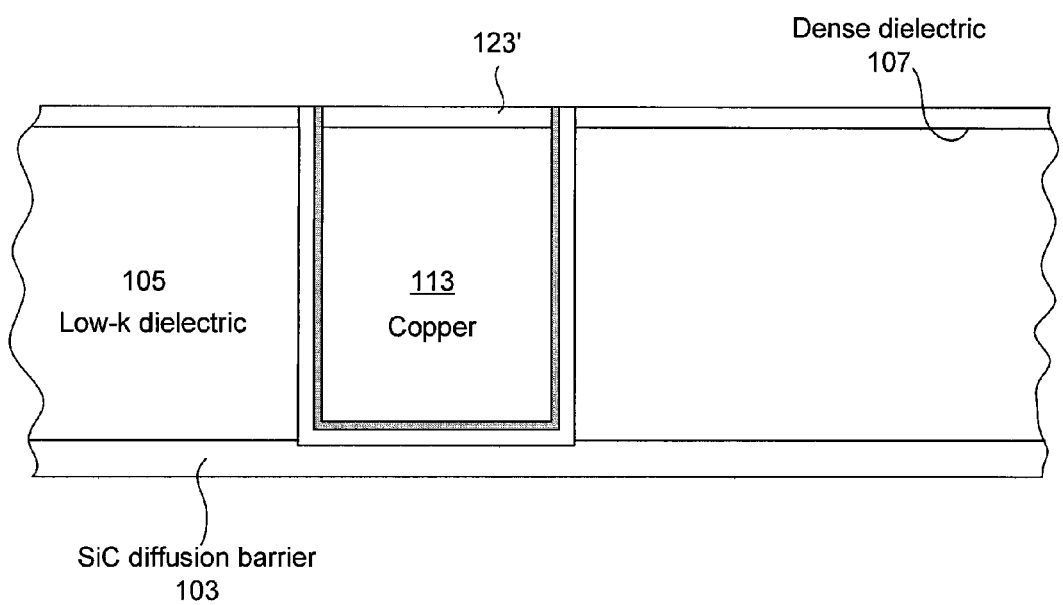

After capping layer deposition and optional anneal are performed, the substrate is now ready for thinning (e.g., planarization) to remove excess capping metal and possibly barrier and some amount of underlying dielectric. Examples of suitable removal techniques include chemical mechanical polishing, reactive ion etching, chemical etching, and sputter etching (ion bombardment). The process chosen for this operation may depend, in part, on the composition of the capping layer and/or the composition of the barrier layer and/or the composition of the underlying dielectric layer. In the embodiment depicted in FIG. 1E, a top portion of the capping layer is removed along with portions of the field regions, specifically the barrier layer 109/111 and an upper portion of the dense dielectric layer 107. In one embodiment, the thickness of capping layer remaining at the end of the removal process is between about 25 and 1000 Angstroms, more specifically between about 50 and 200 Angstroms. Note that in FIGS. 1A through 1D, a horizontal dashed line is shown, which represents the level in the metallization stack which will become the exposed surface after the final planarization to produce the structure of FIG. 1E.

An example of a CMP slurry for removing a cobalt capping layer includes the components such as citric acid, hydrogen peroxide, silica or alumina, tetraethyltetraamine (TETA), and tetramethyl- or tetraethyl-ammonium hydroxide (as a neutralizing/pH adjusting agent). Examples of suitable reactive ion etching conditions to remove the capping layer, as well as coplanar barrier and dielectric material include sulfur hexafluoride, and boron tetrafluoride. Other fluorinated compositions may also be employed for this purpose. A specific example of an etchant suitable for selectively removing excess tantalum capping layer is a hot strong alkaline solution containing a tetraalkylammonium hydroxide, or alkali metal hydroxide (NaOH or KOH).

In certain embodiments, an isotropic etch is employed to the remove unwanted capping metal (e.g. cobalt) and may be employed prior to a barrier/oxide CMP step to reduce the possibility of scratching, or to create a recess of the capping layer below the field or the barrier/dielectric, or to facilitate the process in other ways.

Process Flow

Figure 2:
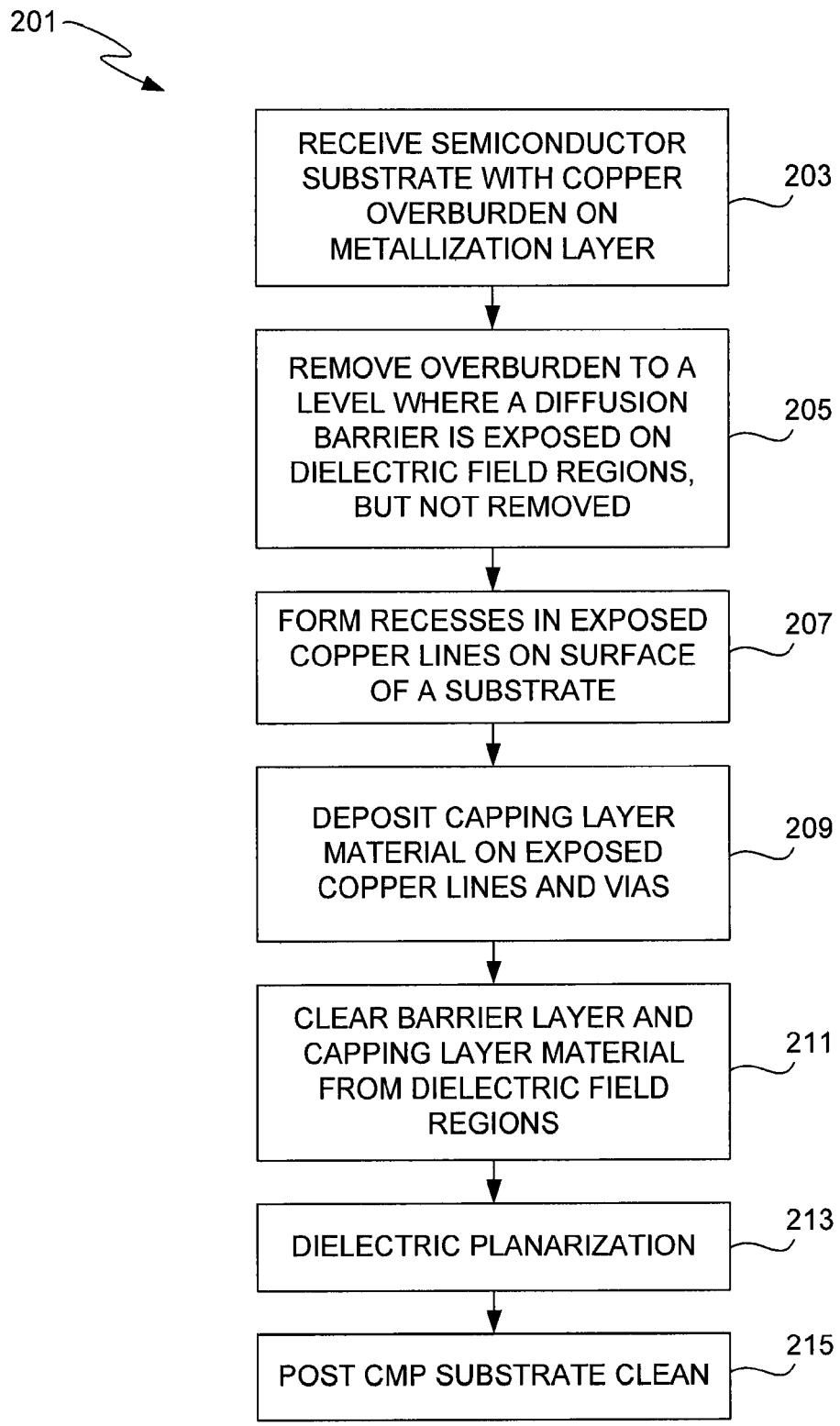
FIG. 2 is a process flow chart for an embodiment of the present invention.

A flow chart depicting a sequence of operations that may be employed in certain embodiments of the invention is presented in FIG. 2. This flow chart depicts a typical sequence 201 of primary process operations but should not be considered limiting. As indicated certain embodiments of the invention do not employ each and every operation depicted in FIG. 2.

The process begins at block 203 with a semiconductor substrate having a copper overburden layer on the active processing surface of a top metallization layer. The substrate is then processed to remove the overburden to a point where a diffusion barrier is exposed on dielectric field regions, but is not removed. See block 205. Copper CMP, ECMP, or MMEP or a combination of planar plating or SAP and (optionally) isotropic wet etch may be performed for this purpose. Note that the overburden may be removed to a point where a small amount of copper is left on the substrate surface or, as suggested in block 205, all copper is removed to expose the barrier layer.

Next, the substrate is treated in a manner that forms recesses in the exposed copper lines. See block 207. This may involve a selective isotropic etch, which leaves the barrier layer substantially in place and intact. Appropriate etch conditions are described above. At this point, a capping layer deposition takes place. See block 209. Options for deposition include electroless or electrolytic plating of cobalt and alloys of cobalt, selective tungsten deposition, PVD deposition of tantalum, etc. In certain embodiments, the deposition process is highly, but not necessarily completely, selective to the exposed copper lines and vias.

At this point in the process 201, the top portions of the capping layer, as well as the exposed diffusion barrier layer is removed from the dielectric field regions by, e.g., a CMP process optimized to remove barrier and capping layer materials. See block 211. Optionally, there is a subsequent dielectric planarization step (block 213). The necessity and/or extent of this step depends on whether dielectric planarization has been performed at an earlier stage in the process.

Finally, the process is concluded, as indicated at a block 215, by a capping layer/dielectric post-CMP clean. Exemplary post-CMP cleaning technologies are described in examples above.

Apparatus/Tools

As suggested above, many different apparatus configurations may be employed with this invention. Preferably some or all of the separate process modules are integrated to facilitate transfer and reduce exposure to the ambient. In certain embodiments all or some of the process modules are linked in a single tool.

Figure 3:
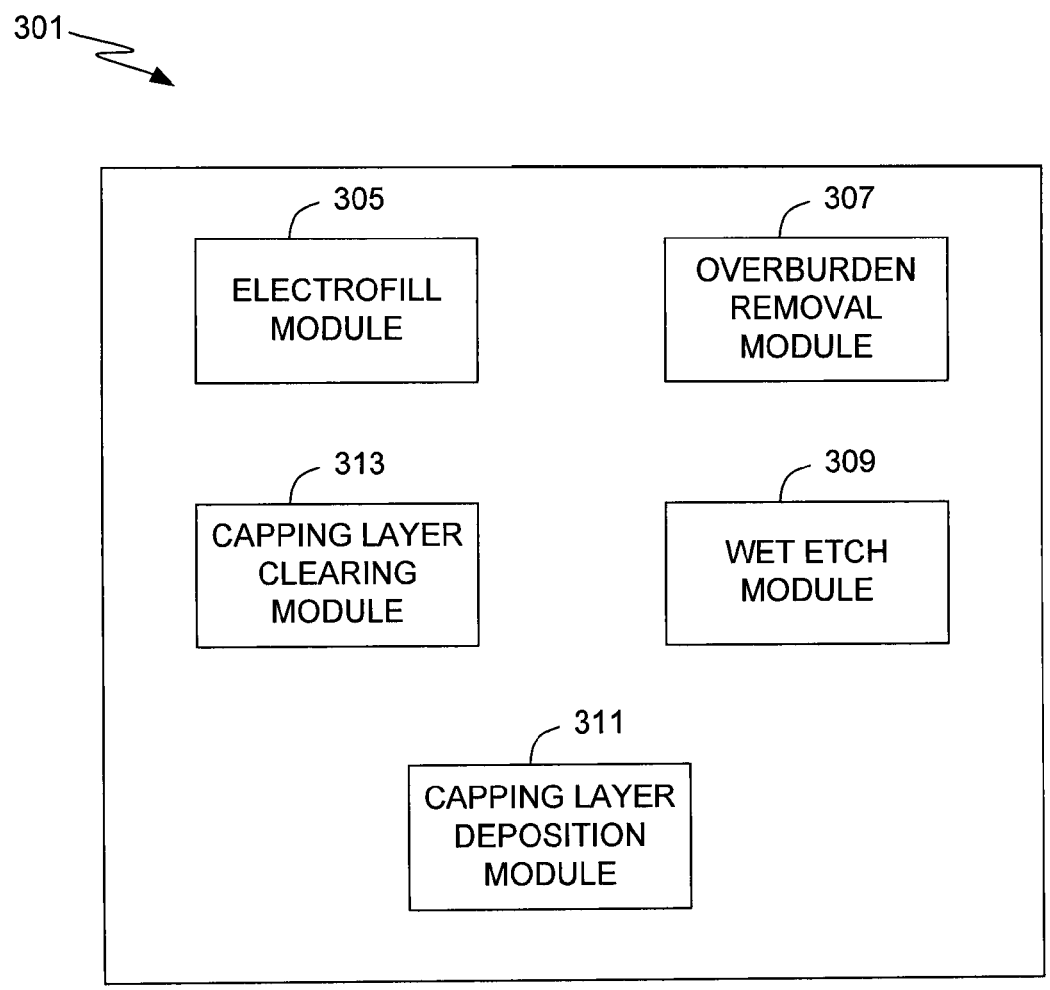
FIG. 3 is a block diagram showing a tool configuration that would incorporates wet etching and electroless deposition stations, among others.

Among the process modules that may be employed in embodiments of this invention (and are depicted together in FIG. 3) are (i) an electrofill module (e.g., a planar plating or SAP electrofill module) 305, (ii) an overburden removal module (e.g., a copper CMP or ECMP tool) 307, (iii) a wet etch module 309, (iv) an electroless deposition module 311, and (v) a module 313 for removing excess capping layer deposited with module 311. Module 313 may also remove the barrier and some of the underlying dielectric material; the typical case is a separate CMP apparatus. In certain embodiments, each of these distinct process modules is provided as a separate station or module within a single integrated tool 301 so that a wafer can be automatically transferred from one to the other, possibly all in a single vacuum enclosure.

In certain embodiments, electroless deposition module 311 may be replaced with an electroplating tool, a CVD tool, an ALD tool, or the like. In certain embodiments, the overburden removal module 307 is optimized to perform AFP. As an example, one or both of the modules 307 and 313 is a Xceda CMP tool (Novellus, Systems, Inc., San Jose, Calif.), which enables high throughput, parallel processing of wafers by using multiple polishing heads.

In further embodiments, an anneal station may be provided together with the other tools in the apparatus. As noted above, an anneal is optionally performed to drive some of the cobalt or other capping layer material into the underlying copper lines to improved adhesion and reduce electromigration.

Other Embodiments

Various details have been omitted for clarity's sake, and various design alternatives may be implemented. The present examples are to be considered as illustrative and not restrictive, and the invention is not to be limited to the details given herein, but may be modified within the scope of the appended claims.

What is claimed is:

1. A method of forming a capping layer on conductive lines in a semiconductor device, the method comprising:
   (a) providing a semiconductor substrate comprising a dielectric layer having (i) copper lines disposed therein, (ii) a barrier layer on at least field regions of the dielectric layer, and (iii) copper overburden covering the copper lines and barrier layer;
   (b) removing said copper overburden by a technique other than an isotropic wet etch to a point prior to exposing the barrier layer;
   (c) isotropically wet etching the remaining overburden to expose the barrier layer and selectively remove material from said copper lines to form recesses in the copper lines while providing an exposed barrier layer on field regions of the dielectric layer; and
   (d) depositing a capping layer material on at least the recessed copper lines of the semiconductor substrate.

2. The method of claim 1, wherein depositing the capping layer material comprises an electrolytic or electroless process.

3. The method of claim 1, wherein the capping layer material comprises cobalt or an alloy thereof.

4. The method of claim 1, further comprising thinning the semiconductor substrate after (d) to remove some fraction of the capping layer material deposited in (d), while maintaining at least some of the capping layer material over the exposed copper lines.

5. The method of claim 1, wherein (b) comprises removing copper overburden comprising at least one of chemical mechanical polishing and abrasive-free planarization.

6. The method of claim 1, wherein selectively removing material comprises chemically etching the conductive lines with an etchant comprising an oxidizing agent and a copper complexing agent, wherein the etchant has a pH of greater than 5.

7. The method of claim 1, wherein depositing the capping layer material forms a layer of said capping material selectively over the exposed conductive lines without depositing the capping layer on the barrier.

8. The method of claim 1, wherein the barrier layer comprises at least one of tantalum, titanium, and tungsten.

9. The method of claim 7, wherein depositing the capping layer material comprises electroless plating.

10. The method of claim 7, wherein depositing the capping layer material comprises electroplating.

11. An apparatus for forming a capping layer on interconnect conductive lines in a semiconductor device, the apparatus comprising:
   (a) a first planarization module configured to remove a portion of an interconnect overburden from a semiconductor substrate without removing all of the interconnect overburden and without exposing a diffusion barrier layer on a dielectric field;
   (b) a wet etching module configured for removing the remaining overburden and forming recesses in the interconnect conductive lines without removing the diffusion barrier layer;
   (c) a capping layer material deposition module for depositing said capping layer material on at least the exposed recessed conductive lines produced by the wet etching module.

12. The apparatus of claim 11, further comprising:
   (d) a second polishing or planarization module configured to remove at least excess capping layer material deposited by the capping layer deposition module.

13. The apparatus of claim 11, wherein the first planarization module is a chemical mechanical polishing module.

14. The apparatus of claim 11, wherein the capping layer material deposition module is an electroless deposition module configured for selective electroless deposition of the capping layer onto the interconnect conductive lines.

15. The apparatus of claim 11, wherein the capping layer material deposition module is an electrolytic deposition module configured for selective electrolytic deposition of the capping layer onto the interconnect conductive lines.

16. The apparatus of claim 11, wherein the wet etching module is configured for contacting the semiconductor device with a wet etchant, wherein the etchant comprises a copper complexing agent and an oxidizing agent, and wherein the etchant has a pH greater than about 5.

17. The apparatus of claim 11 wherein at least the first planarization module and the wet etching module are integrated in one tool.

18. The apparatus of claim 16, wherein the copper complexing agent comprises an amino acid and wherein the oxidizing agent comprises a peroxide.

19. An apparatus for forming a capping layer on an interconnect conductive line in a semiconductor device, the apparatus comprising:
   (a) a wet etching module configured for forming a recess in an interconnect conductive line while substantially preserving a diffusion barrier layer on a field region of the semiconductor device, wherein the module is configured for contacting the semiconductor device with a wet etchant comprising an oxidizing agent and a copper complexing agent, the etchant having a pH greater than about 5;
   (b) a capping layer material deposition module for depositing said capping layer material on at least the exposed interconnect conductive line produced by the wet etching module.

20. An apparatus of claim 19, wherein the capping layer material deposition module is configured for selective electroless or electrolytic deposition of the capping layer onto the interconnect conductive line in a presence of exposed diffusion barrier layer.

* * * * *